United States Patent
Suto

(10) Patent No.: US 8,981,723 B2
(45) Date of Patent: Mar. 17, 2015

(54) AIR BATTERY SYSTEM

(75) Inventor: Koji Suto, Susono (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 355 days.

(21) Appl. No.: 13/515,085

(22) PCT Filed: Dec. 24, 2009

(86) PCT No.: PCT/JP2009/071475
§ 371 (c)(1),
(2), (4) Date: Jun. 11, 2012

(87) PCT Pub. No.: WO2011/077532
PCT Pub. Date: Jun. 30, 2011

(65) Prior Publication Data
US 2012/0249080 A1 Oct. 4, 2012

(51) Int. Cl.
*H02J 7/00* (2006.01)
*H01M 12/08* (2006.01)
*H01M 10/48* (2006.01)

(52) U.S. Cl.
CPC .............. *H01M 12/08* (2013.01); *H01M 10/48* (2013.01)
USPC ......................................... 320/127; 320/136

(58) Field of Classification Search
CPC .... H02J 7/0031; Y02E 60/12; G01R 31/3648
USPC ................................. 320/127, 136
See application file for complete search history.

(56) References Cited

U.S. PATENT DOCUMENTS

2014/0191727 A1* 7/2014 Toussaint et al. ............. 320/134

FOREIGN PATENT DOCUMENTS

| CN | 1170250 A | 1/1998 |
|---|---|---|
| CN | 1938895 A | 3/2007 |
| JP | A-5-258781 | 10/1993 |
| JP | A-2007-524204 | 8/2007 |
| JP | A-2008-181853 | 8/2008 |
| JP | A-2009-32415 | 2/2009 |
| WO | WO 2005/083829 A2 | 9/2005 |

OTHER PUBLICATIONS

Hasegawa et al., "Study of lithium/air secondary batteries-Stability of NASICON-type lithium ion conducting glass-ceramics with water," Journal of Power Sources, 2009, pp. 371-377, vol. 189, Elsevier.

Apr. 6, 2010 International Search Report issued in International Patent Application No. PCT/JP2009/071475.

* cited by examiner

*Primary Examiner* — Suresh Memula
(74) *Attorney, Agent, or Firm* — Oliff PLC

(57) ABSTRACT

An air battery system that can inhibit production of hydrogen. The air battery system includes a battery cell which is provided with an air electrode, an anode containing an active material capable of releasing lithium ions, and a solid electrolyte layer and aqueous electrolytic solution layer having lithium ion conductivity which are disposed between the air electrode and the anode; a detecting device which is capable of detecting a voltage between the anode and the air electrode; and a signaling device which emits a signal when the voltage detected by the detecting device becomes 2.2 V or less.

4 Claims, 5 Drawing Sheets

AIR BATTERY SYSTEM

TECHNICAL FIELD

The present invention relates to an air battery system.

BACKGROUND ART

An air battery is a battery adopting oxygen as a cathode active material; and at the time of discharge, it takes in an oxygen-containing gas from the outside. As such, it is possible to have a larger proportion of an anode active material in the battery case, compared with other types of batteries comprising cathode and anode active materials therein. Accordingly, in principle the air battery is characterized to have a large dischargeable electric capacity and to be easily reduced in size and weight. Further, since oxygen to be employed as the cathode active material has a strong oxidation power, the electromotive force of the battery is relatively high. Moreover, oxygen is characterized to be a clean resource whose amount is not limited, and therefore the air battery is environmentally-friendly. The air battery with many advantages in this way is expected to be used for hybrid vehicles, portable appliances etc., and the high performance of the air battery is demanded these days.

As a technique related to such an air battery, Patent Document 1 for example discloses a battery cell comprising a lithium anode, non-aqueous electrolyte, solid electrolyte, aqueous electrolyte, and cathode.

CITATION LIST

Patent Literatures

Patent Document 1: Japanese Patent Application Laid-Open (JP-A) No. 2007-524204

SUMMARY OF THE INVENTION

Problems to be Solved by the Invention

When using the battery cell disclosed in Patent Document 1, hydrogen may be produced from the cathode side at the time of discharge. When hydrogen is produced, the performance and safety of a battery tend to deteriorate. As such, the technique disclosed in Patent Document 1 has a drawback that it may cause deterioration of the performance and safety of the battery.

Accordingly, an object of the present invention is to provide an air battery system that can inhibit production of hydrogen.

Means for Solving the Problems

In order to solve the above problems, the present invention takes the following means. Specifically, the present invention is an air battery system comprising: a structure which is provided with an air electrode, an anode containing an active material capable of releasing lithium ions, and a solid electrolyte layer and aqueous electrolytic solution layer having lithium ion conductivity which are disposed between the air electrode and the anode; a detecting device which is capable of detecting a voltage between the anode and the air electrode; and a signaling device which emits a signal when the voltage detected by the detecting device becomes 2.2 V or less.

Herein, the "aqueous electrolytic solution layer" refers to a layer containing an electrolytic solution having lithium ion conductivity which contains water as a solvent (hererinafter, this electrolytic solution is referred to as an "aqueous electrolytic solution".). For example, the aqueous electrolytic solution layer may be a layer composed by impregnating a porous separator with the aqueous electrolytic solution. In the present invention, as the aqueous electrolytic solution, an alkaline aqueous solution electrolyte in which a lithium salt is dissolved and others may be used. In the present invention, a lithium salt such as $LiNo_3$, $LiOH$, $LiCl$ and $Li_2S$ may be dissolved in the aqueous electrolytic solution; and when dissolving LiOH for example, the concentration thereof may be 1 mol/L or more and 5 mol/L or less.

In the above present invention, the output of the battery cell is preferably controlled based on the emitted signal, such that the voltage becomes larger than 2.2 V.

Further, in the above present invention, the current value of the battery cell is preferably decreased based on the emitted signal, such that the voltage becomes larger than 2.2 V.

Furthermore, in the above present invention wherein the current value of the battery cell is decreased, the resistance value of a variable resistance device connected to the battery cell is preferably increased based on the emitted signal, such that the voltage becomes larger than 2.2 V.

Additionally, in the above present invention, the operation of the battery cell is preferably stopped based on the emitted signal.

Effects of the Invention

The air battery system of the present invention is provided with a signaling device which emits a signal when the voltage between the air electrode and the anode (hereinafter sometimes simply referred to as a "voltage") becomes 2.2 V or less. When the voltage becomes 2.2 V or less, hydrogen is produced from the air electrode side. So, with the signaling device provided, it becomes possible to inhibit production of hydrogen. Therefore, according to the present invention, it is possible to provide an air battery system which can inhibit production of hydrogen.

In the present invention, the output of the battery cell is controlled based on the emitted signal such that the voltage becomes larger than 2.2 V, and thereby production of hydrogen can be inhibited.

Further, in the present invention, the current value of the battery cell is decreased based on the emitted signal such that the voltage becomes larger than 2.2 V, and even by that production of hydrogen can be inhibited.

Furthermore, in the present invention wherein the current value of the battery cell is decreased based on the emitted signal, the resistance value of the variable resistance device is increased, and thereby the voltage can be easily made larger than 2.2 V.

Additionally, in the present invention, the operation of the battery cell is stopped based on the emitted signal, and thereby production of hydrogen can be prevented.

Figure 1:
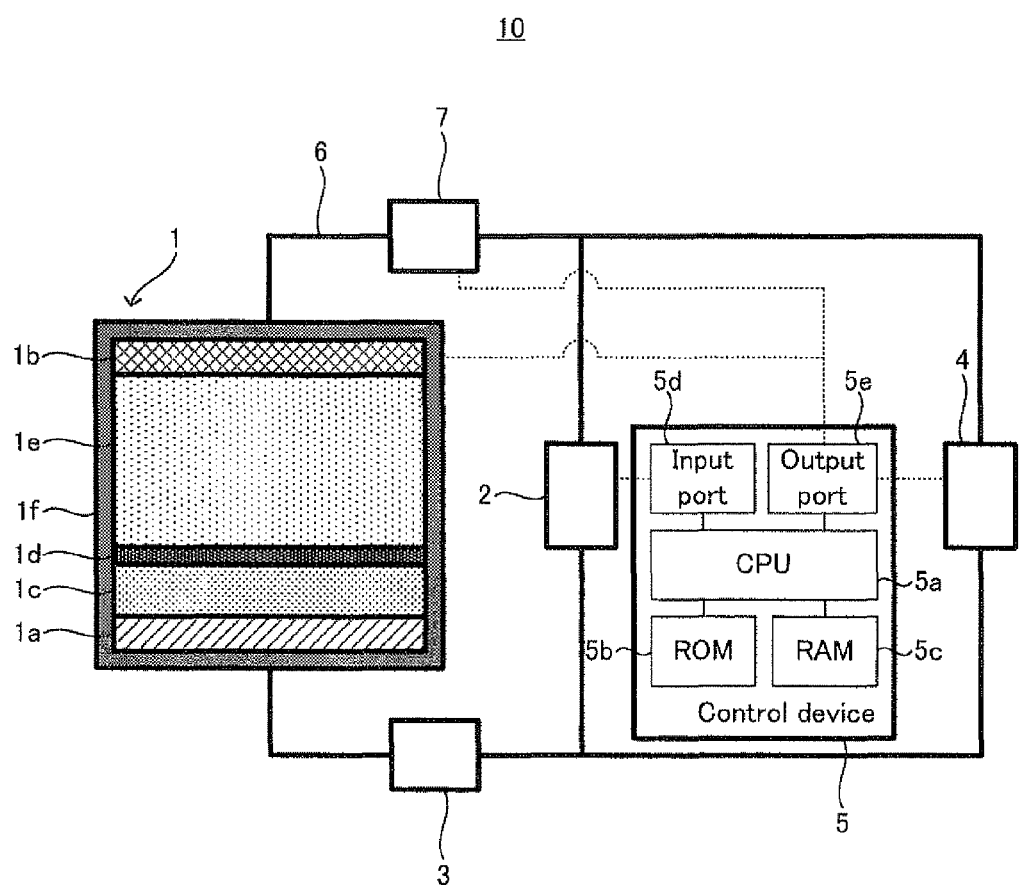
FIG. 1 is a view illustrating the air battery system 10.

DESCRIPTION OF THE REFERENCE NUMERALS 1 air battery cell
1a anode
1b air electrode
1c non-aqueous electrolytic solution layer
1d solid electrolyte layer
1e aqueous electrolytic solution layer
1f housing
2 voltage sensor (detecting device)
3 current sensor
4 variable resistance device (variable resistance)
5 control device (signaling device)
6 electrical circuit
7 device
10 air battery system

MODES FOR CARRYING OUT THE INVENTION

In the air battery using an alkaline aqueous solution electrolyte and a lithium anode, the following structure has been suggested heretofore: a solid electrolyte is disposed between a lithium anode and an air electrode, an organic electrolytic solution is filled between the lithium anode and the solid electrolyte, and an alkaline aqueous solution electrolyte is filled between the solid electrolyte and the air electrode. The discharge reaction of this battery is:

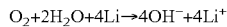
$$O_2 + 2H_2O + 4Li \rightarrow 4OH^- + 4Li^+$$

Figure 3:
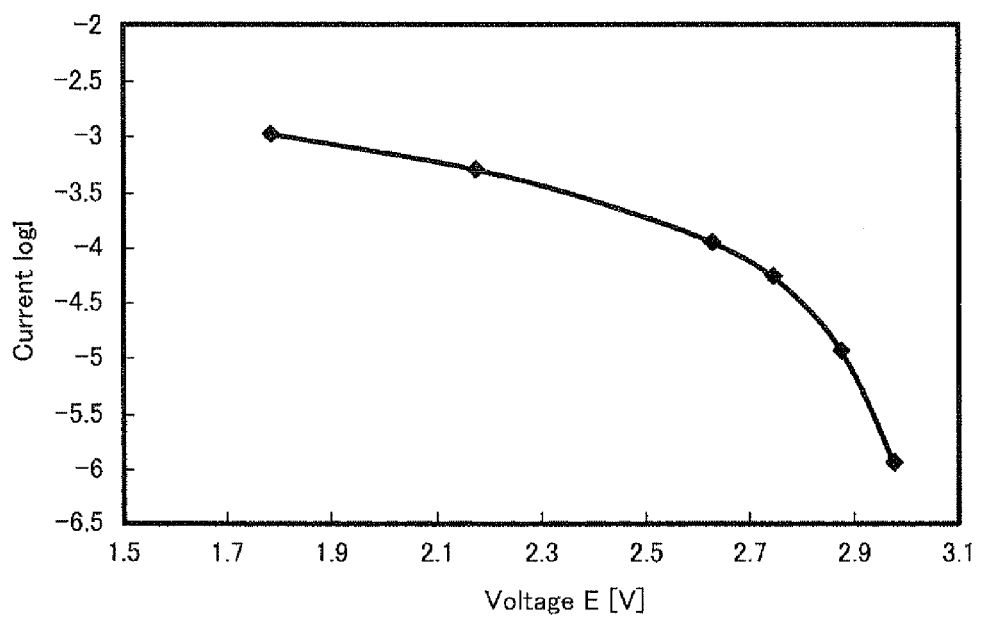
FIG. 3 is a view showing a potential-current curve at steady current discharge.

The electromotive force is 3.446 V. The inventor produced an air battery cell by employing: metal Li for the anode; a polycarbonate solution containing 1 mol/L of LiTFSA, for the organic electrolytic solution; LATP(OHARA Glass manufactured by OHARA Inc.) for the solid electrolyte; a LiOH aqueous solution in which 1 to 5 mol/L of LiOH is dissolved, for the alkaline aqueous solution electrolyte; and for the air electrode, a carbon cloth electrode carrying Pt, or an electrode having carbon cloth coated with a mixture of ketjen black, PTFE, and $MnO_2$ catalyst. Then, a steady current discharge test was conducted in which this air battery cell was operated under atmospheric conditions, 25° C., 100% humidity, and 0.5 mA/cm². thereby a potential-current curve was obtained and the state of the air battery was observed. FIG. 3 shows the potential-current curve. In FIG. 3, the vertical axis represents the logarithm of Current I (logI) and the horizontal axis represents Voltage E [V].

Figure 4:
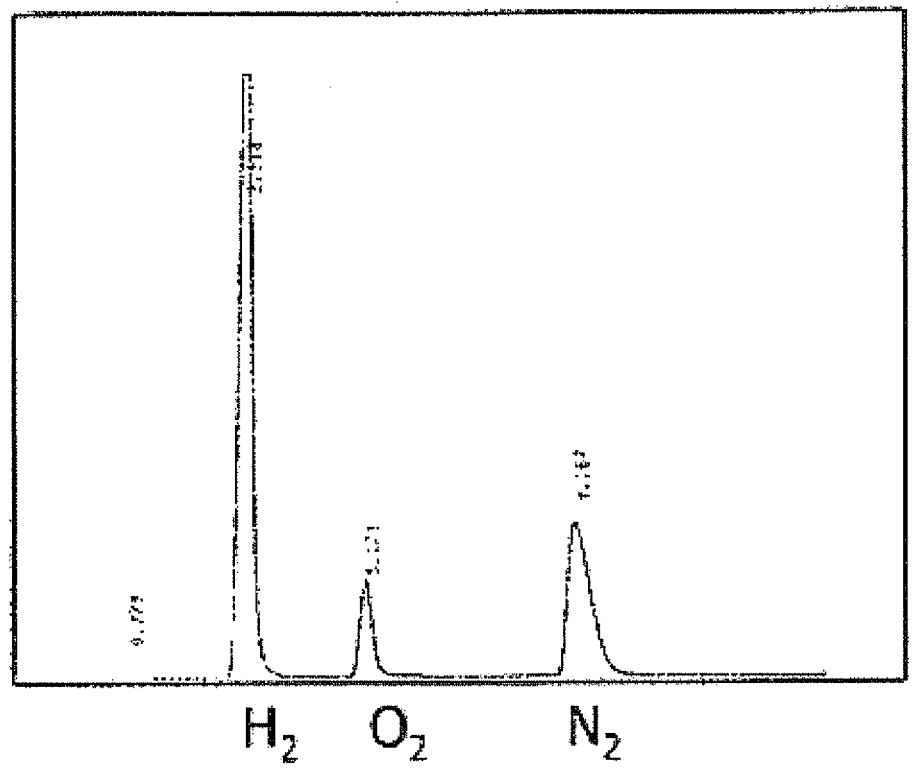
FIG. 4 is a view showing gas chromatography results of gases generated by the discharge.

According to the results of the above steady current discharge test, even when the discharge was carried out for approximately 10 hours at a voltage of around 2.5 V, which is larger than 2.2 V, bubbles were not produced in the alkaline aqueous solution electrolyte. However, when the discharge was carried out for approximately 10 hours at a voltage of around 2.1 V for example, which is below 2.2 V, bubbles were produced in the alkaline aqueous solution electrolyte. Production of bubbles was significant when the voltage was 2.2 V or less. On the other hand, bubbles were not observed in the organic electrolytic solution on the anode side. The inventor used an analytical instrument (GC-8A, manufactured by Shimadzu), to analyze the components of the bubbles by the gas chromatography method. The results are shown in FIG. 4. In FIG. 4, the vertical axis represents the peak intensity and the horizontal axis represents the time. As shown in FIG. 4, a large amount of hydrogen was contained in the bubbles. The amounts of oxygen and nitrogen were approximately the same as in the composition of the atmosphere.

From the above, the inventor discovered that: in the air battery comprising the anode containing an active material capable of releasing lithium ions and the air electrode, and further comprising the solid electrolyte disposed between the anode and the air electrode, and the alkaline aqueous solution electrolyte filled between the solid electrolyte and the air electrode, hydrogen was produced on the air electrode side when the voltage became 2.2 V or less; on the other hand, when the voltage was larger than 2.2 V, hydrogen was not produced on the air electrode side; and hydrogen was not produced on the anode side. The reason is assumed to be as follows: when the voltage is larger than 2.2 V, the reduction reaction of oxygen becomes the main reaction in the air electrode; however when the voltage is 2.2 V or less, adsorption of water on the surface of the air electrode and detachment of water from the surface of the air electrode are facilitated, and consequently a hydrogen producing reaction, which is not supposed to be the main reaction, becomes the main reaction in the air electrode. An example of the hydrogen producing reaction in the alkaline aqueous solution electrolyte is shown below:

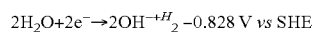
$$2H_2O + 2e^- \rightarrow 2OH^- + H_2 \quad -0.828 \text{ V vs SHE}$$

Figure 5:
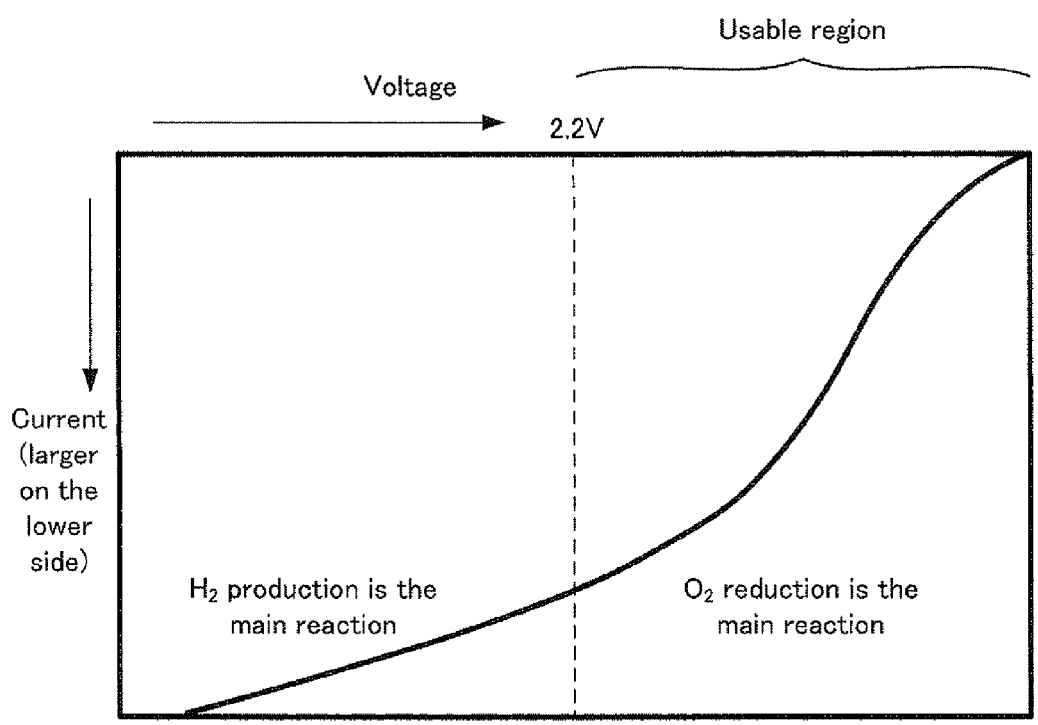
FIG. 5 is a view illustrating a main reaction occurring in the air electrode at the time of discharge.

The output voltage of the air battery is known to decline as the current value rises; thus it is assumed that increase in the current value at the time of discharge causes decrease in the voltage value, thereby causing hydrogen to be easily produced. FIG. 5 shows the relation between the main reaction in the air electrode at the time of discharge and the current and voltage. In FIG. 5, the vertical axis represents the current and the horizontal axis represents the voltage. In FIG. 5, the current is larger on the lower side, and the voltage is larger on the more right side.

Since hydrogen is a flammable gas, it is preferable to prevent production of hydrogen in order to ensure the safety and the like of the air battery. Further, when hydrogen is produced, a seal material and a resin material which are not resistant to hydrogen tend to be deteriorated. In addition, when hydrogen accumulates at the interface between the air electrode and the electrolytic solution, the interface resistance between the electrolytic solution and the air electrode increases, likely causing the voltage to decline and the discharge to be stopped. Furthermore, an electrical noise may be emitted due to the oxidation-reduction equilibrium of hydrogen. In addition, when the hydrogen bubbles grow inside the battery, the inner pressure of the battery increases, likely causing the electrolytic solution to leak through the air electrode. Therefore, in order to avoid these circumstances, it is important to inhibit hydrogen from being produced. It can be seen from the above results that: continuing discharge in a state where the voltage has declined to 2.2 V or less causes hydrogen to be produced; and the production of hydrogen is attributed to the operating voltage of the battery largely deviating from the equilibrium potential of the chemical reaction in the air electrode. Therefore, it is assumed that production of hydrogen can be inhibited or prevented by controlling the operating voltage of the battery so that it does not deviate drastically from the equilibrium potential of the chemical reaction in the air electrode, or by stopping discharge when the operating voltage of the battery declines drastically.

The present invention has been made in view of the above findings; and the main object of the present invention is to provide an air battery system which can inhibit production of hydrogen.

Hereinafter, the present invention will be described with reference to the drawings. It should be noted that the embodiments shown below are examples of the present invention, and therefore the present invention is not limited thereto.

FIG. 1 is a view showing an embodiment of the air battery system of the present invention. The air battery system 10 shown in FIG. 1 comprises: an air battery cell 1; a voltage sensor 2 capable of detecting the voltage; a current sensor 3 capable of detecting the current value of the air battery cell 1; a variable resistance device 4 capable of increasing and decreasing the resistance of an electrical circuit 6 to which the air battery cell 1 is connected; and a control device 5 capable of controlling operation of the variable resistance device 4 based on the results of the voltage detected by the voltage sensor 2. The air battery cell 1 is connected to a device 7 capable of utilizing the electrical energy generated in the air battery cell 1. The air battery cell 1 comprises: an anode 1a containing an active material capable of releasing lithium ions; an air electrode 1b; a non-aqueous electrolytic solution layer 1c filled with a non-aqueous electrolytic solution; a solid electrolyte layer 1d; an aqueous electrolytic solution layer 1e filled with an alkaline aqueous solution electrolyte; and a housing 1f accommodating these. The non-aqueous electrolytic solution layer 1c, solid electrolyte layer 1d, and aqueous electrolytic solution layer 1e which are disposed between the anode 1a and the air electrode 1b have lithium ion conductivity. In the air battery cell 1, the anode 1a is in contact with the non-aqueous electrolytic solution layer 1c; the air electrode 1b is in contact with the aqueous electrolytic solution layer 1e; and the solid electrolyte layer 1d is in contact with the non-aqueous electrolytic solution layer 1c and the aqueous electrolytic solution layer 1e.

In the air battery system 10, when the air battery cell 1 starts to discharge, the voltage is detected by the voltage sensor 2, and the current value is detected by the current sensor 3. The results of the voltage detected by the voltage sensor 2 and the results of the current detected by the current sensor 3 are sent to the control device 5 as output signals. The control device 5 is provided with: a CPU 5a which is capable of performing operational control of the air battery cell 1, the variable resistance device 4, and the device 7; and a memory device for the CPU 5a. The CPU 5a is composed of a combination of a microprocessor unit and various peripheral circuits necessary for the operation thereof. The memory device for the CPU 5a is composed of a combination of a ROM 5b and a RAM 5c and the like, the ROM 5b being for storing a program and various data necessary for the operational control of the air battery cell 1, the variable resistance device 4, and the device 7, and the RAM 5c functioning as an operating area of the CPU 5a. In addition to this configuration, the CPU 5a is combined with a software stored in the ROM 5b; thereby the control device 5 in the air battery system 10 functions. The information regarding the voltage detected by the voltage sensor 2 (an output signal) and the information regarding the current value detected by the current sensor 3 (an output signal) reach the CPU 5a as input signals via an input port 5d of the control device 5. Based on the input signals and the program stored in the ROM 5b, the CPU 5a controls an operating command given to the air battery cell 1, the variable resistance device 4, and the device 7, via an output port 5e. Namely, in the air battery system 10, the control device 5 can function as a signaling device; and the variable resistance device 4 varies the resistance in accordance with the operating command given by the CPU 5a.

When the voltage detected by the voltage sensor 2 is larger than 2.2 V, hydrogen is hardly produced in the air electrode 1b. Therefore in this case, it is not necessary to modify the operations of the air battery cell 1, the variable resistance device 4, and the device 7 in order to inhibit production of hydrogen. On the other hand, when the voltage detected by the voltage sensor 2 is 2.2 V or less, hydrogen is likely to be produced in the air electrode 1b. Therefore in this case, the operations of the air battery cell 1, the variable resistance device 9, and the device 7 are modified in accordance with the operating command given by the control device 5 in order to inhibit or prevent production of hydrogen. The output (electric power) of the air battery cell 1 can be modified such that the voltage is kept constant at a certain value larger than 2.2 V, for example by temporarily increasing the activity of the battery with temporary increase in the battery temperature, excess air sent to the air electrode by the air blast and the like, and addition of an additive or electrolytic solution in an anode or cathode solution layer. The operation of the device 7 can also be modified (for instance, when it is difficult for the air battery cell 1 to maintain the output due to decrease in its capacity, the operation of the device 7 can be stopped while the air battery cell 1 continues to maintain the permissible voltage limit in which hydrogen is not produced). Further, the current value can be decreased by lowering the output (power consumption) of the device 7 so that the voltage becomes larger than 2.2 V. In addition to decreasing the current value by lowering the output (power consumption) of the device 7 so as to make the voltage larger than 2.2 V, the operation of the variable resistance device 4 can be controlled to increase the resistance. On the other hand, in order to prevent production of hydrogen, it is also possible to stop the operation of the air battery cell 1. Additionally, when the current value detected by the current sensor 3 is excessively large, the voltage is likely to decline to 2.2 V or less. And even when an excessively large current value is detected, it is possible to decrease the current value by lowering the output (power consumption) of the device 7.

Figure 2:
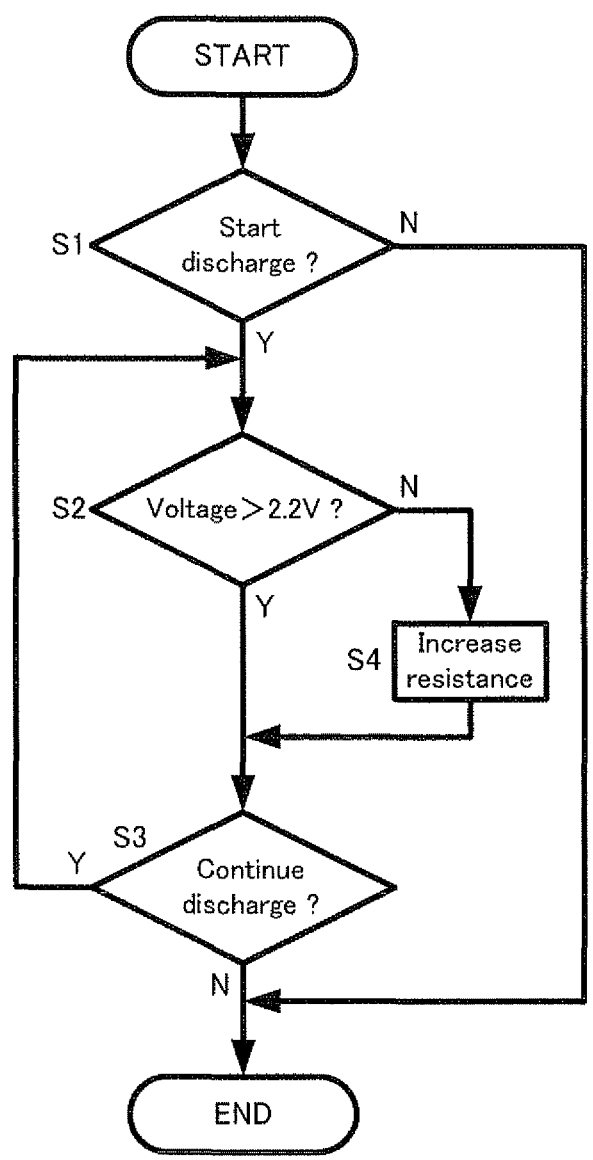
FIG. 2 is a flow chart illustrating a control manner for preventing production of hydrogen.

FIG. 2 is a flow chart illustrating the control manner in which the current value is decreased and the resistance of the variable resistance device 4 is increased based on the results of the voltage detected by the voltage sensor 2. As shown in FIG. 2, in a step S1, it is judged whether the discharge has been started or not. When a negative judgment (NO) is made in the step S1, it is assumed that hydrogen will not be produced from the air electrode; thus the operational control of the variable resistance device 4 for the purpose of inhibiting production of hydrogen from the air electrode is not carried out. When a positive judgment (YES) is made in the step S1, it is continuously judged in a step S2 whether the result of the voltage detected by the voltage sensor 2 is larger than 2.2 V or not. When a positive judgment (YES) is made in the step S2, hydrogen is unlikely to be produced from the air electrode; therefore, the operation of the variable resistance device 4 and the current value are not modified, and it is judged in a step S3 whether to continue the discharge or not. On the other hand, when a negative judgment (NO) is made in the step S2, there is a fear of hydrogen production from the air electrode. Therefore in this case, the current value is decreased and the operation of the variable resistance device 4 is modified by the control device 5 to increase the resistance, so that the voltage becomes larger than 2.2 V (step S4). Thereafter, it is judged in the step S3 whether to continue the discharge or not. When a positive judgment (YES) is made in the step S3, the process returns to the step S2. On the other hand, when a negative judgment (NO) is made in the step S3, the operational control of the variable resistance device 4 for inhibiting production of hydrogen from the air electrode is terminated.

In this manner, in the air battery system 10, when the voltage becomes 2.2 V or less, the operations of the devices are controlled to make the voltage larger than 2.2 V or to stop the operation of the air battery cell 1. With such an operational control, production of hydrogen from the air electrode can be inhibited. Therefore, according to the present invention, it is possible to provide the air battery system 10 which can inhibit production of hydrogen.

In the air battery system 10, the voltage can be detected after correcting the voltage and the potential of the air electrode in advance by a three-electrode method using a reference electrode. Also, the voltage can be controlled for example by carrying out the absolute value control of the potential of the air electrode using a third electrode (reference electrode). The voltage can be controlled by a two-electrode method; and on the other hand, the potential can be controlled by a three-electrode method using a reference electrode. When carrying out the three-electrode method, the cathode potential and the anode potential are monitored, thereby enabling more effectively carrying out modification of the battery output at the time of decrease in the battery voltage. For instance, with respect to decrease in the cathode potential, an approach can be taken in which the cathode output is temporarily increased (e.g. by the air blast), thereby controlling the potential. With respect to increase in the anode potential, the anode temperature maybe increased or an anode reducing agent may be added, thereby controlling the potential.

In the air battery system 10, the anode 1a contains an active material capable of releasing lithium ions (hereinafter referred to as an "anode active material"); and the anode 1a is provided with an anode current collector (not shown) that abuts the inside or the outer surface of the anode 1a and collects the current of the anode 1a. As the anode active material capable of releasing lithium ions, a known anode active material such as metal lithium and a lithium alloy may be adequately employed. In the air battery system 10, the anode 1a may contain at least the anode active material; and it may further contain a conductive material for improving conductivity and/or a binder for fixing metal and the like.

The conductive material to be contained in the anode 1a is not particularly restricted as long as it can endure the environment in which the air battery system 10 is used and it has conductivity. Examples of such a conductive material include carbon materials having a high specific surface area which are represented by carbon black, activated carbon, carbon fiber, etc. Further, in view of inhibiting decrease in the reaction field and the battery capacity and so on, the content of the conductive material in the anode 1a is preferably 10 mass % or more. Additionally, in view of attaining a sufficient catalyst function and so on, the content of the conductive material in the anode 1a is preferably 99 mass % or less.

The binder to be contained in the anode 1a may be a known binder that is usable in an air battery, such as polyvinylidene fluoride (PVDF), polytetrafluoroethylene (PTFE), and styrene-butadiene rubber (SBR). The content of the binder in the anode 1a is not particularly restricted; however, it is preferably 10 mass % or less for example, and more preferably 1 mass % or more and 5 mass % or less.

In the air battery system 10, a material of the anode current collector that collects the current of the anode 1a is not particularly restricted as long as it has conductivity.

Examples of the material of the anode current collector include copper, stainless steel, and nickel. Further, examples of a shape of the anode current collector include a foil shape, a plate shape, and a mesh (grid) shape. In the air battery system 10, the anode 1a may be produced for example by joining metal lithium to the anode current collector.

In the air battery system 10, as the air electrode 1b, a known air electrode that is usable in an air battery using a solid electrolyte layer and an aqueous electrolytic solution having lithium ion conductivity may be adequately employed. The air electrode 1b may be produced for example by the following procedure: a mixed powder obtained by mixing the conductive material, catalyst, and binder for binding these is put into a solvent and they are mixed and stirred well, thereby producing a paste; and the paste is applied on the air electrode current collector (not shown) by using a spray gun, and dried. Examples of the solvent that can be used when producing the air electrode 1b may be volatile solvents such as acetone, N,N-dimethylformamide (DMF), and N-methyl-2-pyrrolidone (NMP); and a solvent having a boiling point of 200° C. or less may be preferably employed.

The conductive material to be contained in the air electrode 1b is not particularly restricted as long as it can endure the environment in which the air battery system 10 is used and it has conductivity. Examples of such a conductive material include carbon materials having a high specific surface area which are represented by carbon black, activated carbon, carbon fiber, etc. Further, in view of inhibiting decrease in the reaction field and the battery capacity and so on, the content of the conductive material in the mixed powder is preferably 10 mass % or more. Additionally, in view of attaining a sufficient catalyst function and so on, the content of the conductive material in the mixed powder is preferably 99 mass % or less.

Examples of the catalyst to be contained in the air electrode 1b include: a manganese oxide; a platinum group catalyst (metal including Pt, Ir, Pd etc.; an alloy and oxide thereof); a perovskite-type catalyst (having a perovskite-type structure; and being an oxide represented by $A_{1-x}A'_xB_{1-y}B'_yO_3$ (wherein A is a lanthanoid; A' is a lanthanoid, or an alkaline earth metal such as Ca, Ba, and Sr, or K; B is a transition metal element; and B' is a first transition metal such as Mn, Co, Fe, Ni, Cr, V, and a second transition metal such as Ru, or Mg.)); and a spinel-type oxide. In view of attaining a sufficient catalyst function and so on, the content of the catalyst in the mixed powder is preferably 1 mass % or more. Further, in view of inhibiting decrease in the reaction field and the battery capacity and so on, the content of the catalyst in the mixed powder is preferably 90 mass % or less. The binder to be contained in the air electrode 1b may be a known binder that is usable in an air battery, such as polyvinylidene fluoride (PVDF), polytetrafluoroethylene (PTFE), and styrene-butadiene rubber (SBR). The content of the binder in the mixed powder is not particularly restricted; however, it is preferably 10 mass % or less for example, and more preferably 1 mass % or more and 5 mass % or less.

A material of the air electrode current collector that collects the current of the air electrode 1b is not particularly restricted as long as it has conductivity. Specific examples include stainless steel, nickel, aluminum, iron, titanium, and carbon. Further, examples of a shape of the air electrode current collector include a foil shape, a plate shape, and a mesh (grid) shape. Among these, in the present invention, the air electrode current collector is preferably in a mesh shape since it shows excellent current collecting efficiency. In this case, the air electrode current collector in a mesh shape is disposed inside the air electrode 1b.

In the air battery system 10, the non-aqueous electrolytic solution layer 1c is filled with a non-aqueous electrolytic solution having lithium ion conductivity; and it is composed for example by retaining the non-aqueous electrolytic solution in a porous separator. The non-aqueous electrolytic solution contained in the non-aqueous electrolytic solution layer $1c$ contains a lithium salt and an organic solvent. Examples of the lithium salt include: an inorganic lithium salt such as $LiPF_6$, $LiBF_4$, $LiClO_4$, and $LiAsF_6$; and an organic lithium salt such as $LiCF_3SO_3$, $LIN(CF_3SO_2)_2$, $LiN(C_2F_5SO_2)_2$, and $LiC(CF_3SO_2)_3$. Examples of the above organic solvent include: ethylene carbonate (EC); propylene carbonate (PC); dimethyl carbonate (DMC); diethyl carbonate (DEC); ethyl methyl carbonate (EMC) butylene carbonate; γ-butyrolactone; sulfolane; acetonitrile; 1,2-dimethoxymethane; 1,3-dimethoxypropane; diethyl ether; tetrahydrofuran; 2-methyltetrahydrofuran; and a mixture thereof. In addition, the above organic solvent is preferably a solvent high in oxygen solubility since the dissolved oxygen can be used efficiently for reaction. The concentration of the lithium salt in the non-aqueous electrolytic solution is for example in a range of 0.2 mol/L to 3 mol/L. In the present invention, a low-volatile liquid such as an ionic liquid may be used as the non-aqueous electrolytic solution. Further, examples of the separator for retaining the non-aqueous electrolytic solution not only include porous membranes of polyethylene, polypropylene, etc.; but also include non-woven fabrics such as a resin non-woven fabric and a glass fiber non-woven fabric.

In the air battery system 10, the solid electrolyte layer $1d$ is filled with a solid electrolyte having lithium ion conductivity. Examples of the solid electrolyte to be filled in the solid electrolyte layer $1d$ not only include $(Li, La)TiO_3$ and $Li_{1.5}Al_{0.5}Ti_{1.5}(PO_4)_3$; but also include solid electrolytes having a garnet-type structure. The solid electrolyte layer $1d$ filled with such a solid electrolyte can be produced by a known method.

In the air battery system 10, the aqueous electrolytic solution layer $1e$ is filled with an aqueous electrolytic solution having lithium ion conductivity; and it is composed for example by retaining the aqueous electrolytic solution in a porous separator. Examples of the aqueous electrolytic solution to be contained in the aqueous electrolytic solution layer $1e$ may include: an alkaline aqueous solution electrolyte in which a lithium salt is dissolved; and a neutral aqueous solution electrolyte in which a lithium salt is dissolved. In the present invention, a lithium salt such as $LiNo_3$, $LiOH$, $LiCl$, and $Li_2S$ may be dissolved in the aqueous electrolytic solution. In the case of dissolving LiOH, the concentration thereof may be 1 mol/L or more and 5 mol/L or less. Further, when dissolving LiOH, the concentration of the saturated solution is 5 mol/L (5.12 mol/L); and even in a state when the deposit of LiOH exists exceeding the concentration, the air battery system 10 of the present invention can be operated. Further, examples of the separator for retaining the aqueous electrolytic solution not only include porous membranes of polyethylene, polypropylene, etc.; but also include non-woven fabrics such as a resin non-woven fabric and a glass fiber non-woven fabric.

In the present invention, the device 7 may be for example a motor for hybrid vehicles or portable information appliances.

In the above description of the present invention, a configuration has been introduced as an example in which configuration the operations of each of the devices in the air battery system of the present invention are controlled depending on whether or not the voltage detected by the voltage sensor 2 is 2.2 V or less; however, the present invention is not limited to this configuration. It is also possible to adopt a configuration in which the operations of each of the devices are controlled depending on whether or not the voltage is $2.2+αV$ (α having a certain margin) or less.

Further, in the above description of the present invention, a configuration in which the non-aqueous electrolytic solution layer $1c$ is provided has been introduced as an example; however, the present invention is not limited to this configuration. The air battery system of the present invention may adopt a configuration wherein the non-aqueous electrolytic solution layer is not provided. In cases where the non-aqueous electrolytic solution layer is not provided, the solid electrolyte layer and the aqueous electrolytic solution layer may be disposed between the anode and the air electrode; the anode and the solid electrolyte layer may be contacted with each other; the solid electrolyte layer and the aqueous electrolytic solution layer may be contacted with each other; and the aqueous electrolytic solution layer and the air electrode may be contacted with each other.

Industrial Applicability

The air battery system of the present invention can be used as a power source and the like for electric vehicles and portable information appliances.

The invention claimed is:

1. An air battery system comprising:
   a battery cell which is provided with an air electrode, an anode containing an active material capable of releasing lithium ions, and a solid electrolyte layer and aqueous electrolytic solution layer having lithium ion conductivity which are disposed between the air electrode and the anode;
   a detecting device which is capable of detecting a voltage between the anode and the air electrode; and
   a signaling device which emits a signal when the voltage detected by the detecting device becomes 2.2 V or less, wherein the output of the battery cell is controlled based on the emitted signal, such that the voltage becomes larger than 2.2 V.

2. The air battery system according to claim 1, wherein the current value of the battery cell is decreased based on the emitted signal, such that the voltage becomes larger than 2.2 V.

3. The air battery system according to claim 2, wherein the resistance value of a variable resistance connected to the battery cell is increased based on the emitted signal, such that the voltage becomes larger than 2.2 V.

4. The air battery system according to claim 1, wherein the operation of the battery cell is stopped based on the emitted signal.

* * * * *